(12) United States Patent
Blanchard et al.

(10) Patent No.: US 7,138,289 B2
(45) Date of Patent: Nov. 21, 2006

(54) TECHNIQUE FOR FABRICATING MULTILAYER COLOR SENSING PHOTODETECTORS

(75) Inventors: Richard A. Blanchard, Los Altos, CA (US); Richard K. Robinson, Dallas, TX (US)

(73) Assignee: JBCR Innovations, LLP, Dallas, TX (US)

( * ) Notice: Subject to any disclaimer, the term of this patent is extended or adjusted under 35 U.S.C. 154(b) by 296 days.

(21) Appl. No.: 10/886,435

(22) Filed: Jul. 7, 2004

(65) Prior Publication Data

US 2006/0008937 A1    Jan. 12, 2006

(51) Int. Cl.
   *H01L 21/00*    (2006.01)
(52) U.S. Cl. .............................. 438/57; 438/67; 438/74
(58) Field of Classification Search ................ 438/57, 438/61, 64, 66, 67, 73, 74, 404, 407; 250/208.1
   See application file for complete search history.

(56) References Cited

U.S. PATENT DOCUMENTS

| 5,488,251 | A |  | 1/1996 | Mizutani et al. |
| 5,949,073 | A |  | 9/1999 | Shimoyama |
| 6,127,714 | A |  | 10/2000 | Mochizuki |
| 6,133,954 | A |  | 10/2000 | Jie et al. |
| 6,166,365 | A |  | 12/2000 | Simonetti et al. |
| 6,171,885 | B1 |  | 1/2001 | Fan et al. |
| 6,177,289 | B1 |  | 1/2001 | Crow et al. |
| 6,177,710 | B1 |  | 1/2001 | Nishikata et al. |
| 6,188,056 | B1 |  | 2/2001 | Kalnitsky et al. |
| 6,821,810 | B1 * | 11/2004 | Hsiao et al. ................... 438/69 |
| 6,876,049 | B1 * | 4/2005 | Fan et al. ................... 257/432 |

OTHER PUBLICATIONS

Knipp, Herzog, and Steibeg, Stacked Amorphous Silicon Color Sensors, Jan. 2002 vol. 49, No. 1, IEEE Transactions on Electron Devices.
Kelly, Zia, Ashruf, and French, Galvanic Cell Formation: A Review of Approaches to Silicon Etching for Sensor Fabrication, Aug. 2001, IEEE Sensors Journal.
Grossman, Images at 50 Mpixels/s, Jul. 24, 2000, Electronic Design, p. 61-66.
Southwell, Modeling of Optical Thin Films, May 1999, Vacuum & Thinfilm.
MacLeod, An Introduction of Optical Coating Design, May 2001, Vacuum Technology & Coating, p. 44-54.
Lehmann, The Physics of Macropore Formation in Low Doped n-Type Silicon, J. Electrochem. Soc., vol. 140, No. 10, Oct. 1993, p. 2836-2843.

(Continued)

*Primary Examiner*—Tuan H. Nguyen

(57) ABSTRACT

A multilayer color-sensing photodetector is fabricated in a semiconductor wafer having a single crystal structure to form a first, second and third layer of single crystal semiconductor material. A dielectric layer is formed that completely surrounds each single crystal region. A blocking layer is applied to prevent ion implantation where not desired. Ions are implanted into a predefined implant area. The semiconductor wafer is heated to create a dielectric layer part way through the single crystal semiconductor region. The second layer of single crystal semiconductor materials is formed by depositing a single crystal or polycrystalline material and annealing it to form a single crystal semiconductor. The deposited semiconductor layer is masked and etched to obtain single crystal regions directly above the previous layer. A blocking layer is applied and an ion implant is performed. After heating, there is left a region of single crystal silicon that has its sides and bottom surrounding by a dielectric border. The third layer of semiconductor material is likewise deposited and processed to form a top layer of single crystal semiconductor material.

30 Claims, 25 Drawing Sheets

OTHER PUBLICATIONS

Levin, The Next Photography Revolution: Here Comes a Digital-Camera Chip that Could Change Everything, Dec. 2002, Discover, p. 55-55-61.

Bursky, Highly Integrated Image Sensors Cut System Cost, Complexity, Oct. 28, 1999, Electronic Design, p. 64-72.

* cited by examiner

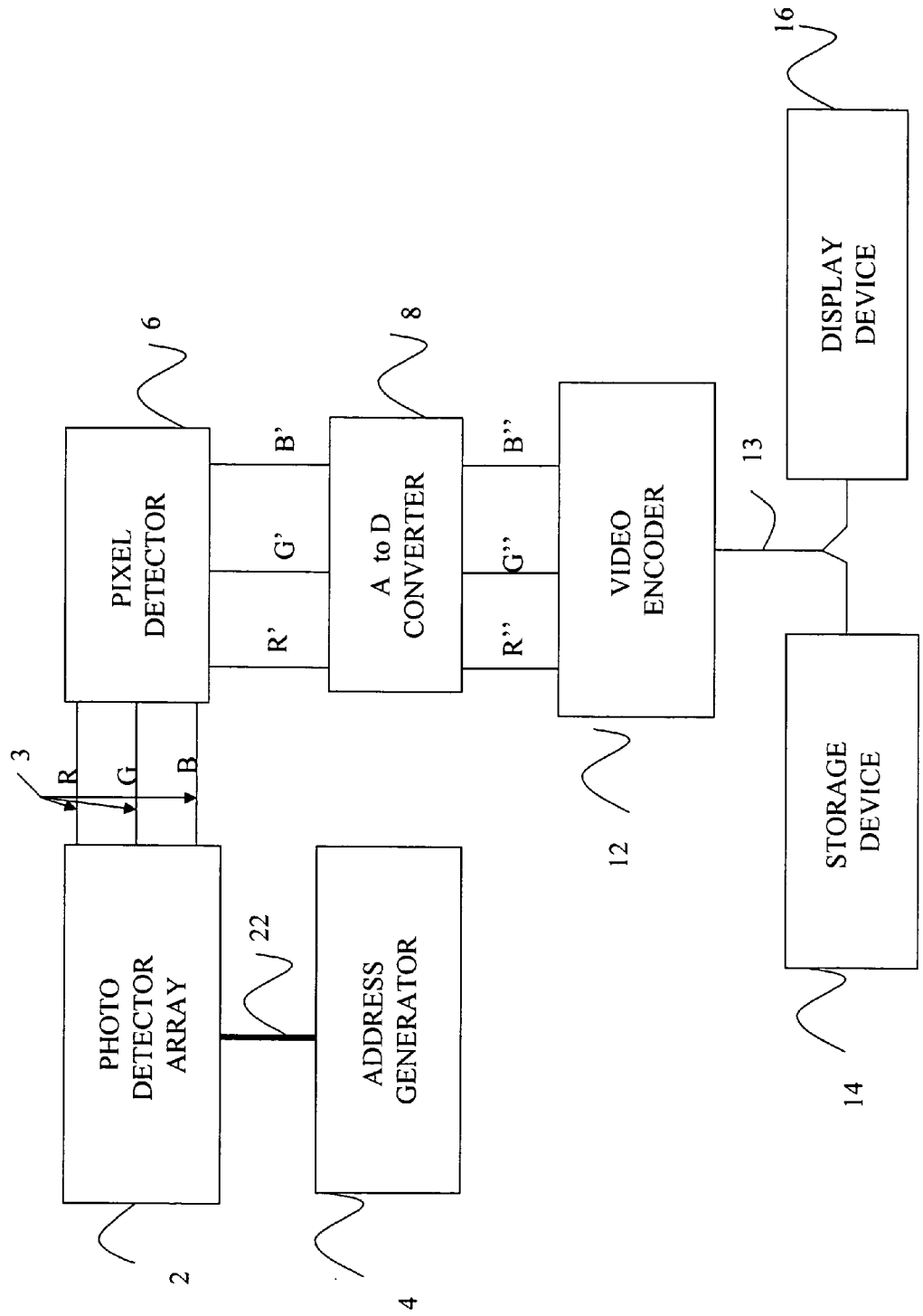

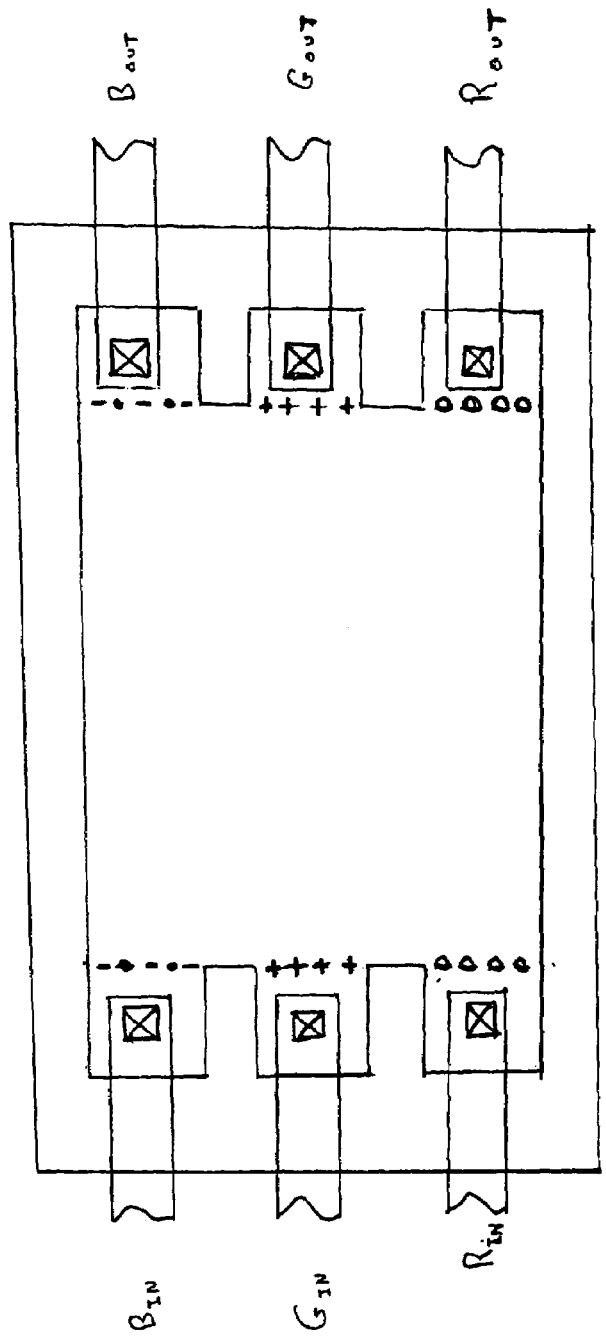
Figure 3a. Top view of the three isolated rectangular regions of single crystal silicon with polycrystalline silicon input and output regions.

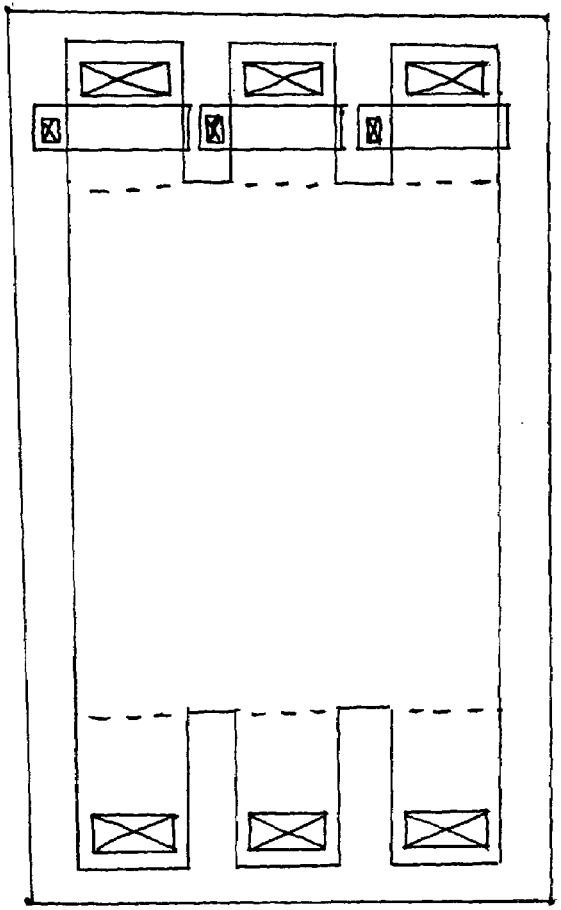
Figure 4a. Top view of the three isolated single crystal regions with each single crystal region including one MOSFET to control signals.

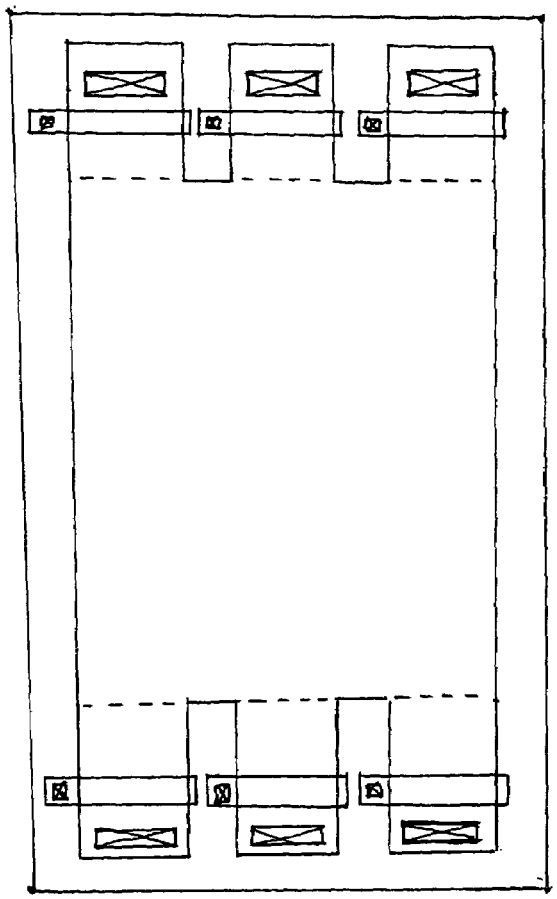
Figure 5a top view of the three isolated single crystal regions, with each single crystal region including two MOSFETs to control input and output signals

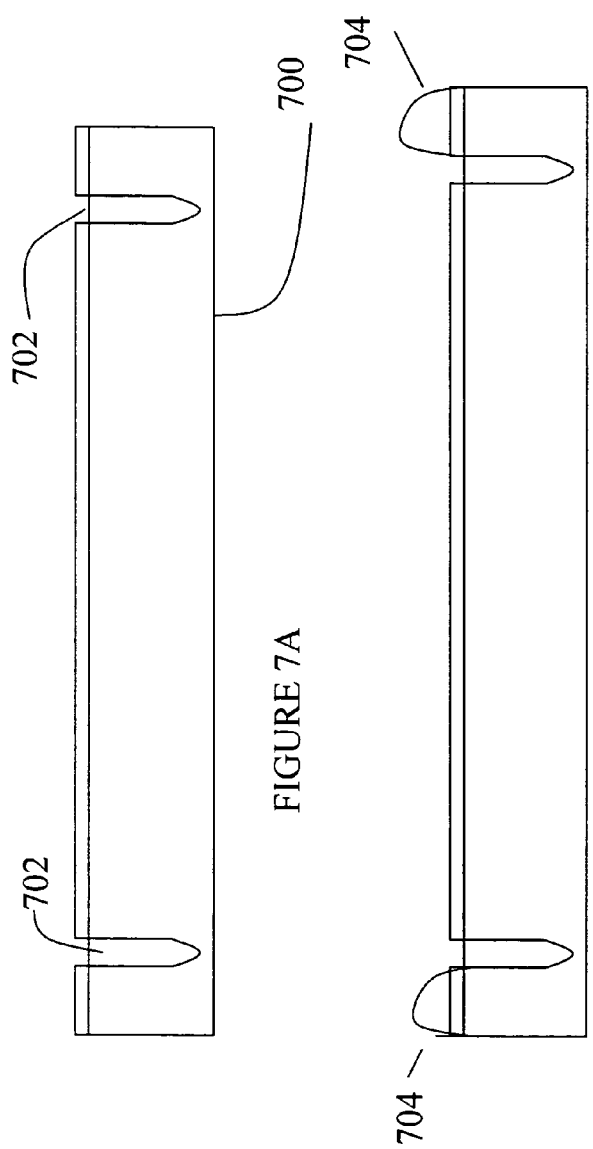
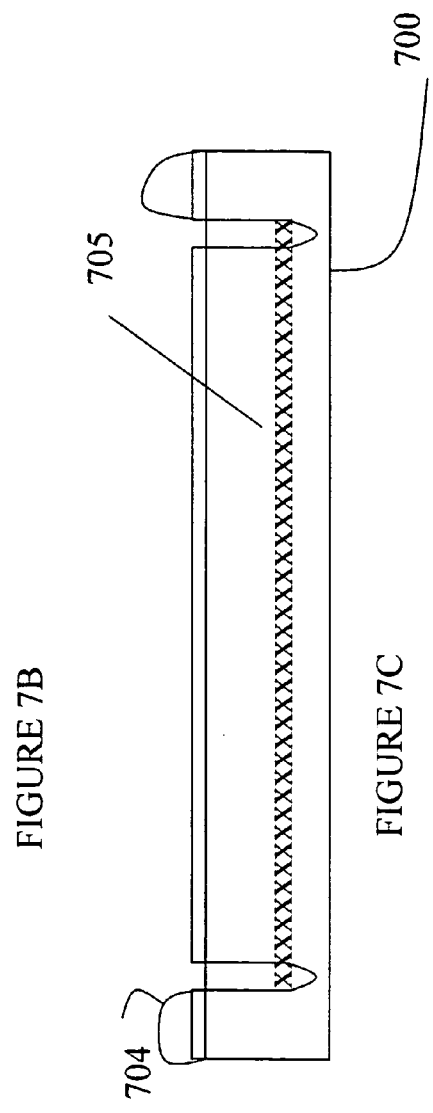
FIGURE 7A
FIGURE 7B
FIGURE 7C

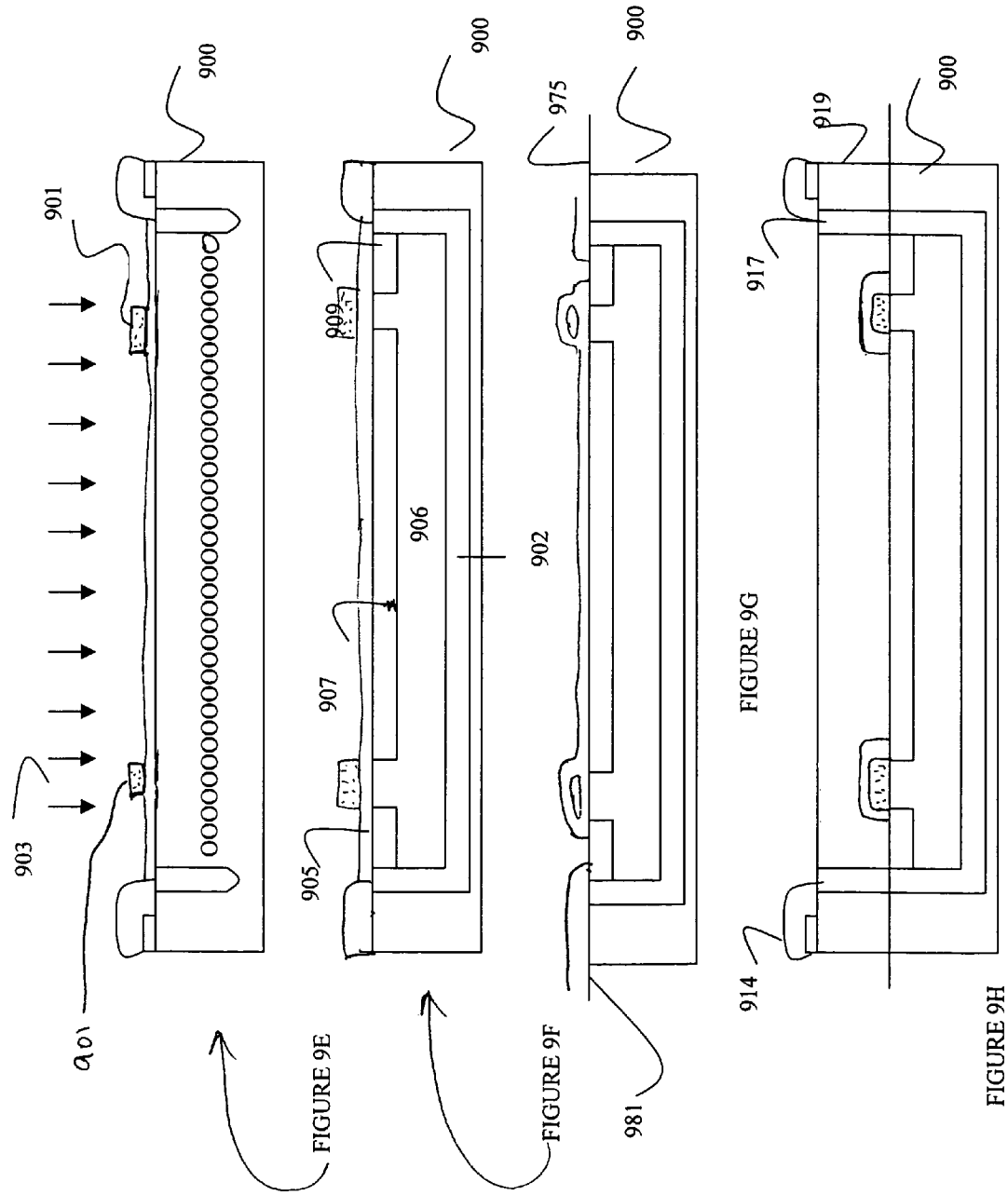

TECHNIQUE FOR FABRICATING MULTILAYER COLOR SENSING PHOTODETECTORS

BACKGROUND OF THE INVENTION

This invention relates to Multilayer Color Sensing Photodetectors and the method of fabricating such devices.

Photodetectors are used in a variety of applications such as digital cameras and video cameras. Photodetectors used in applications such as these may be one of a variety of devices including photodiodes, photoresistors, phototransistors and other photosensitive devices.

In both digital still cameras and digital video cameras, information about the color of the incident light is typically obtained through the use of filters that are present above the individual photodetectors. These filters allow light of only a specified color through to the underlying photodetector. If three colors of light are to be detected, three types of filters are required, and three photodetectors are often needed for each pixel.

The deposition of layers of polycrystalline semiconductor material separated by a dielectric layer is routine. In an article entitled Stacked Amorphous Silicon Color Sensors, by Dietmar Knipp et al., IEEE Transactions on Electronics Devices, Vol. 49, No. 1, January 2002, which is hereby incorporated by reference, there is described a multilayer photodetector structure used in the prior art. Three layers of semiconductor material are separated by two layers of intervening dielectric material. Other examples of prior art devices include: U.S. Pat. No. 5,949,073, dated Sep. 7, 1999, and describes, "a photodetector, a photo semiconductor element is covered by a cap with an incident window permitting incident light to penetrate through a translucent member. The photo semiconductor element detects a quantity of incident light penetrating through the translucent member of the incident window. The translucent member of the incident window is made of a material capable of suppressing the transmitting light quantity of incident light components having wavelengths less than 700 nm and larger than 900 nm. A photoelectric current output of the photosensitive semiconductor element is controlled by the incident light penetrating through the translucent member of the incident window. The photosensitive semiconductor element operates in multiple ways as a thermosensing sensor and a photosensing sensor."

U.S. Pat. No. 6,177,710, dated Jan. 23, 2001, which is hereby incorporated by reference, describes, "a semiconductor waveguide type photodetector, a layered structure is formed on a semiconductor substrate, the layered structure formed by building a first semiconductor layer, a second semiconductor layer and a third semiconductor layer in due order, the first semiconductor layer being of one of p-type and n-type, the second semiconductor layer having lower bandgap energy than that of the first semiconductor layer, the third semiconductor layer having higher bandgap energy than that of the second semiconductor layer and having a conductive type opposite to that of the first semiconductor layer, and wherein at least the second semiconductor layer of the layered structure has a semiconductor waveguide having a mesa stripe structure, and at least a side surface and/or a light incidence end face of the second semiconductor layer is curved."

U.S. Pat. No. 6,171,885, dated Jan. 9, 2001, which is hereby incorporated by reference, describes "a high efficiency color filter process for semiconductor array imaging devices, a microelectronic method is described for optimizing the fabrication of optical and semiconductor array structures for high efficiency color image formation in solid-state cameras. Disclosed is an ordered fabrication sequence in which microlens formation precedes color filter layer formation to enable increased image light collection efficiency, to encapsulate and protect the microlens elements from chemical and thermal processing damage, to minimize topographical under layer variations which would axially misalign or otherwise aberrate microlens elements formed on non-planar surfaces, and, to complete the most difficult steps early in the process to minimize rework and scrap. A CMOS, CID, of CCD optoelectronics configuration is formed by photolithographically patterning a planar array of photodiodes on a silicon or a III–V, II–VI or other compound semiconductor substrate. The photodiode array is provided with metal photoshields, passivated, planarized, and, a first convex microlens array of high curvature or other suitable lenses are formed thereon. A transparent encapsulating material is deposited to planarize the microlens layer and provide a spacer for the successive deposition of one or more color filter layers. The microlens array may be formed from positive photoresist and the spacer from negative resist, with close attention to matching the index of refraction at layer interfaces. A final surface layer comprising a color filter completes the solid-state color image-forming device".

SUMMARY OF INVENTION

A multilayer color sensing photodetector is fabricated in a semiconductor wafer. Polycrystalline material is not as sensitive a photodetector as single crystal material. For this reason, the formation of layers of single crystal semiconductor material allows the fabrication of an array of stacked photodetectors having a smaller chip size than a corresponding array of stacked polycrystalline photodetectors that are sensitive to the same wavelengths of light.

An array of photodetectors having three layers of single crystal semiconductor material may be fabricated using the following sequence of process steps. (Additional layers of single crystal semiconductor material may be added, if desired, by repeating the same steps additional times.)

A trench etch and oxide fill step is performed to define the boundaries of each stacked photodetector on the semiconductor wafer. A blocking layer of photoresist or other suitable material is deposited and defined using a photolithographic process on the surface of the wafer. This blocking layer prevents the ion implantation of oxygen or another species where it is not desired. The isolated single crystal region is formed by a high dose implantation of oxygen, or another species such as nitrogen, to begin to convert the silicon (or other material) to a dielectric below the region of single crystal material. An anneal operation is performed to complete the conversion of the material to dielectric and to form an electrically isolated semiconductor layer. Either a layer of single crystal semiconductor material is deposited, or a layer of polycrystalline semiconductor material is deposited and annealed to form single crystal semiconductor material. This just deposited semiconductor layer is either masked and etched or is selectively oxidized to obtain a single crystal region directly above the light sensing portion of the previous layer, as well as the previously deposited layer(s), while allowing for electrical access to the just deposited layer.

All of the processes in the above paragraph are repeated two additional times to form a second and third layer of isolated single crystal semiconductor material.

This invention disclosure describes a technique for fabricating Multilayer Color Sensing Photodetectors, which allow the formation of single crystal structures instead of polysilicon structures.

The discussed process may be used to manufacture photodetectors of various types including photoresistors, photodiodes, and phototransistors. In addition, these single crystal regions may be used to fabricate other active and passive components that form part of the circuit.

BRIEF DESCRIPTION OF THE FIGURES

FIG. 1 is a block diagram of a photographic product, such as a video camera;

DETAILED DESCRIPTION OF THE EMBODIMENTS

Figure 2B:
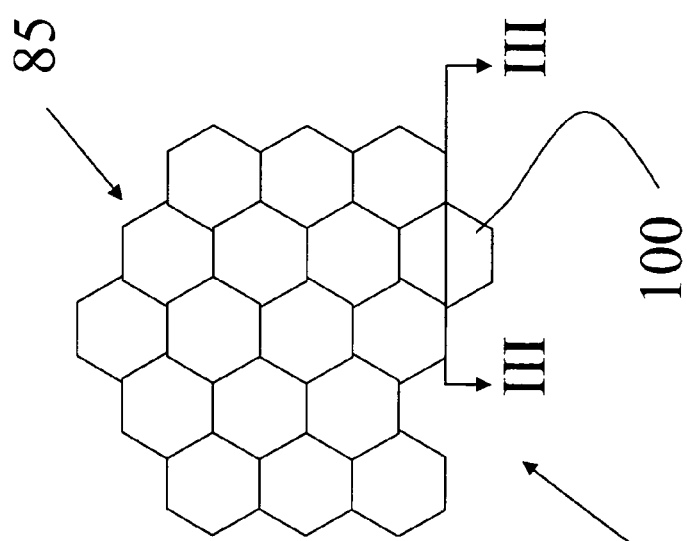
FIG. 2 is a top view of a detector array of photodetector cells of the photographic device of FIG. 1.

Referring to FIG. 1, there is shown a block diagram of a possible camera or other photographic device that is implemented according to the invention. For video applications, an address generator 4 will address photodetector array 2 through a databus 22. The address generator 4 is well known in the art and essentially a frequency generator and a counter. If it is a PAL (Phase Alternation Lines) system, then the counter will be a ring counter. However, if the system is for use in parts of the world other than the US, then the counter will be an up/down counter. So that the addressing of the photodetector is compliant with the SECAM (SEquentiel Couleur Avec Mé moire).

The photodetector array 2 is manufactured according to the teachings of this invention and will provide three output signals 3 for red (R), green (G), and blue (B) detected light. The output signals are applied to a pixel detector 6 which detects the light from each pixel location, and passes the analog representation of light at each pixel detector to an analog-to-digital converter 8. The analog-to-digital converter 8 converts three output signals 3 on conductors R', G', and B' of the pixel detector 6 to a digital representation of the detected light for application to a video encoder 12 via three conductors R", G", and B". The video encoder 12 is a type of device that is known in the art and discussed in U.S. Pat. No. 6,133,954. The video encoder provides on an luminance line 13. The luminous signals for application are sent to either a display device 16 such as a CRT, flat panel display, or other type of video display, or to a storage device 14 which can be a tape, CD, DVD, or other memory device.

Figure 2A:
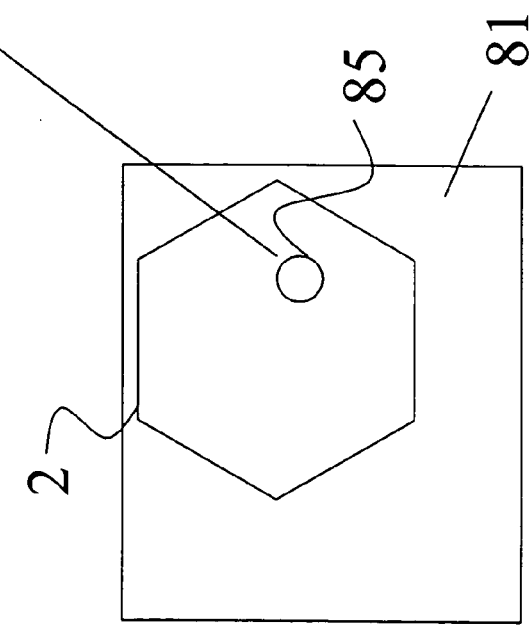

Referring to FIG. 2a, there is illustrated a top view of the photodetector array 2 of FIG. 1. The photo-detector array 2 includes a circuit area 81 which can be used to charge and read each of cell of the array 2. The partial array 85 of the array 2 includes a plurality of detector cells 100 arranged in a polygonal shape such as the hexagonal shapes illustrated in FIG. 2b. Each cell 100 of the detector array 2 has a closed shape such as a circle, a polygon or other closed shapes. An enlargement circle 85 is shown in FIG. 2b, where each cell 100 can be represented by the top and cross sectional views of FIG. 3.

Referring to FIG. 3a, there is illustrated a top view of the three stacked photodetectors along with their respective inputs and outputs. The three photodetectors overlay each other, but their respective inputs and outputs are shown as being offset from each other.

Figure 3B:
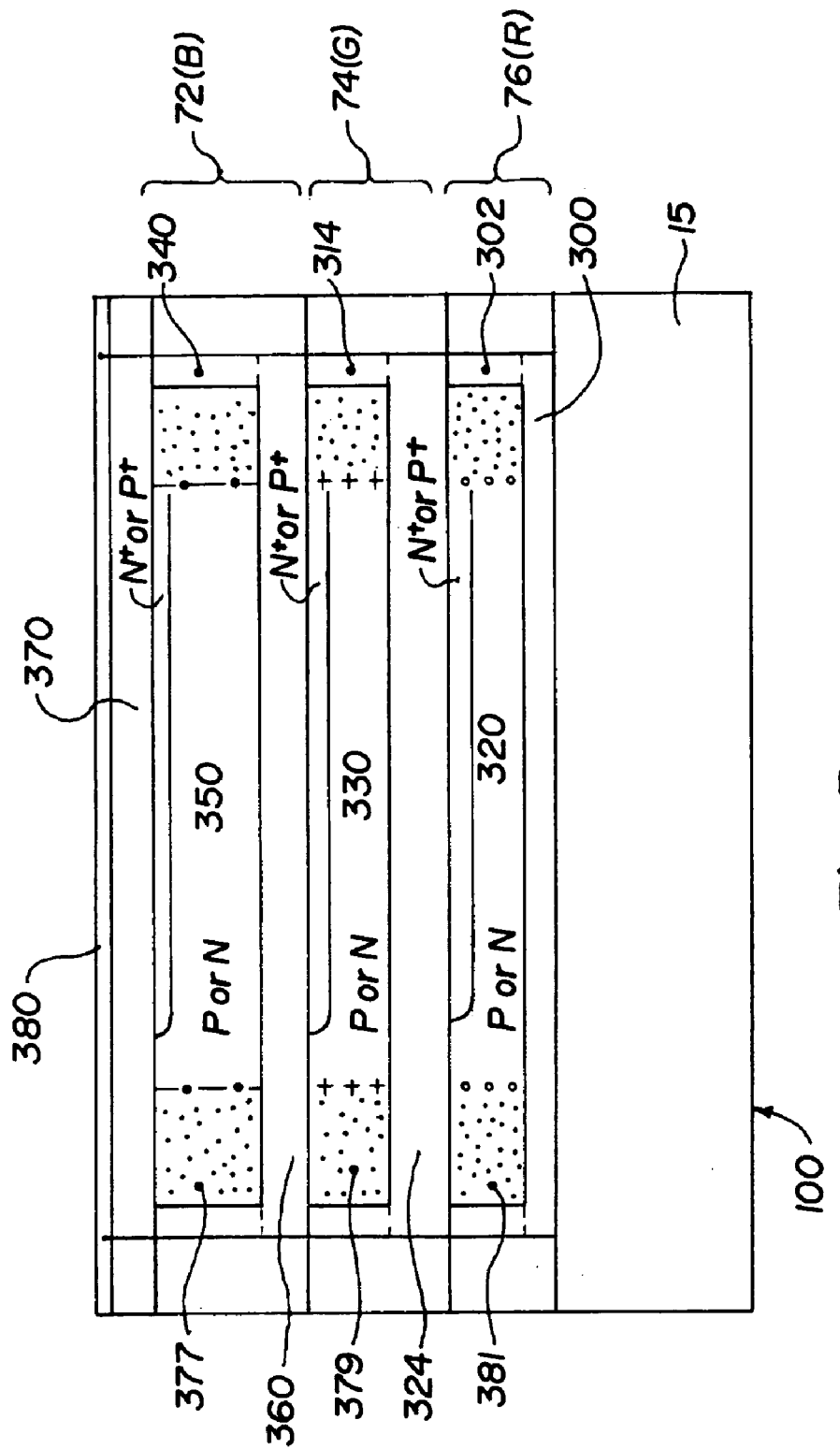
FIG. 3 shows both a top view and a sectional view of a cell of the photodetector cell array of FIG. 2, as seen from sectional lines III—III.

Referring to FIG. 3b, a sectional view from lines III—III of FIG. 2, the color photodetector cell 100 is shown and includes a vertical stack of 3 cells, a blue detector cell 72, a green detector cell 74, and a red detector cell 76. The color photodetector cell 100 is fabricated on a single crystal substrate 15, and may have a transparent layer 380 covering the vertically stacked color cells. Although not necessary, each cell may be charged by applying a charge voltage or current to semiconductor region 377 for the blue cell 72, to semiconductor region 379 for the green cell 74, and to semiconductor region 381 for the red cell 76. As stated above, although the charging of each cell is not necessary, it is a common way to operate photodiodes.

The blue detector cell 72 includes a single crystal semiconductor layer 350 that has been doped to be either P or N type conductivity. The single crystal semiconductor layer 350 is surrounded on its sides by a dielectric layer such as oxide boundary 340. A top dielectric layer 370 has a thickness and composition selected to successfully allow the transmission of the incident light. The selection of the charge applied to the blue detector 72 and the type and quantity of doping material all have an effect on the sensitivity of the detector. However, a single crystal detector will be more sensitive than the prior art amorphous detector.

The green detector cell 74 includes a single crystal semiconductor layer 330 that has been doped to be either P or N type conductivity. It is covered by dielectric layer 360. The thickness of layers 380, 370, 350 and 360 as well as the composition of layers 380, 370 and 360 are selected to allow the transmission of only light with wavelengths between and including red and green. The single crystal semiconductor layer 330 is surrounded on its sides by a dielectric layer such as an oxide boundary 314. The dielectric layer 360 is situated on top of the single crystal semiconductor layer 330. It is anticipated that the thickness, the selection of the charge applied to the green detector 74, as well as the type and quantity of doping material all have an effect on the sensitivity of the detector. However, as stated above, a single crystal detector will be more sensitive than the prior art amorphous detector. Additionally, the thickness and material of the green detector 74 will be affected by the thickness of the dielectric layers used for the blue detector 72. The single crystal semiconductor layer 330 is further isolated from the red detector 76 by a dielectric layer 324.

The red detector cell 76 includes a single crystal semiconductor layer 320 that has been doped to be either P or N type conductivity. The single crystal semiconductor layer 320 is surrounded on its sides by a dielectric such as oxide boundary 302. The selection of the charge applied to the red detector, the type and quantity of doping material all have an effect on the sensitivity of the detector. However, as stated above, a single crystal detector will be more sensitive than the prior art amorphous detector. Additionally, the thickness and material of the blue and green detectors including the thickness and composition of the dielectric layers above them will all have an affect on the thickness of the dielectric layer 324 and applied charge. The single crystal semiconductor layer 320 is further isolated from the substrate 15 by a dielectric layer 300.

FIG. 4a is similar to FIG. 3a, but has an MOS transistor in series with each output. This MOS transistor may be used to control the current that flows from each output, or to control the voltage that is present on each output.

Figure 4B:
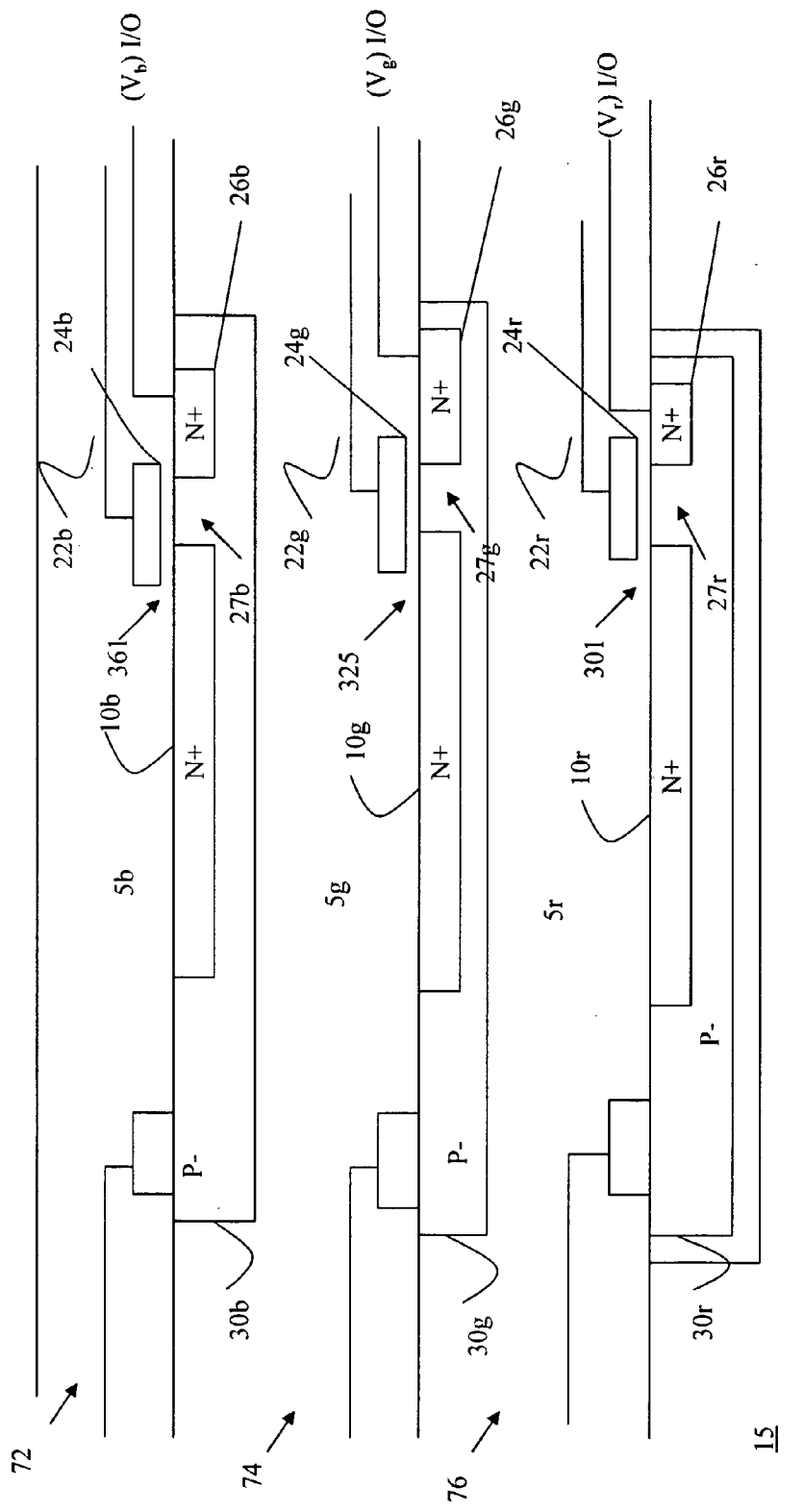
FIG. 4 shows a first alternative top view and sectional view of the cell of the photodetector cell array of FIG. 2, as seen from sectional lines III—III.

Similar to FIG. 3b, FIG. 4b shows an alternate embodiment of the invention as seen from Lines III—III, the color photodetector cell 100 is shown and includes a vertical stack of 3 cells, a blue detector cell 72, a green detector cell 74, and a red detector cell 76. The color photodetector cell 100 is fabricated in and on a single crystal substrate 15. Contained within photodetector cell 100 are transistors 27r, 27g and 27b. Each transistor consists of two N+ regions, 10r, and 26r, 10g and 26g, and 10b and 26b formed in p-type regions 30r, 30g, 30b. A gate 24r, 24g and 24b. Gate 22r, 22g and 22b, when enabled, allow the signal Vr, Vg and Vb to charge the N+ regions 10r, 10g and 10b of the red, green and blue detector cells, respectively, which are subsequently discharged by the incident light.

Each semiconductor region 10 is covered by a dielectric layer 5. Each of the dielectric layers can be manufactured to either pass or absorb different color lights. The blue dielectric layer 5b should pass all color of light and the semiconductor layer 10b should absorb just the blue component of light. The transmission can be controlled by optimizing the thickness and composition of dielectric layer 5b while the absorption can be controlled by optimizing the thickness and doping of semiconductor regions 10b and 30b. The same conditions hold for the green and red photosensing layers.

In operation, the three photodiodes of photosensor cell 100 are initially charged by transistor 27. The p-type regions 30b, 30g and 30r of the three photodiodes are electrically connected to a voltage, such as ground. The voltage does not have to be the same, but may be. They are subsequently read after a time period reasonable for accumulating enough light brightness data. The blue read transistor 27b is enabled by control line 22b, the green read transistor 27g is enabled by the control line 22g, and the red read transistor 27r is enabled by the control line 22r from the address generator 4. By vertically stacking the photo cells as shown in FIG. 3 and FIG. 4, the chip area of the photodetector array 2 is reduced by approximately two-thirds from that of the prior art single crystal devices.

The blue read transistor 23b includes a portion of the N+ region 10b and N+ region 26b that is located within the P-blue detector 30b, a gate 24b is isolated from the N+ regions 10b and 26b by a portion of the dielectric area layer 361. The green read transistor 23g. includes a portion of the N+ region 10g and N+ region 26g that is located within the P-green detector 30g, a gate 24g is isolated from the N+ regions 10g and 26g by a portion of the dielectric layer 325. The red read transistor 23r includes a portion of the N+ region 10r and N+ region 26r that is located within the p-type red detector 30r, a gate 24r is isolated from the N+ regions 10r and 26r by a portion of the dielectric layer 301. The sense current, I sense for each photodiode (or voltage V, sense) is present at the cell output.

FIG. 5a is similar to FIG. 4a, but has two MOS transistors, one on each side of the photosensor. These two transistors may be use to independently control the input and the output to each photosensor.

Figure 5B:
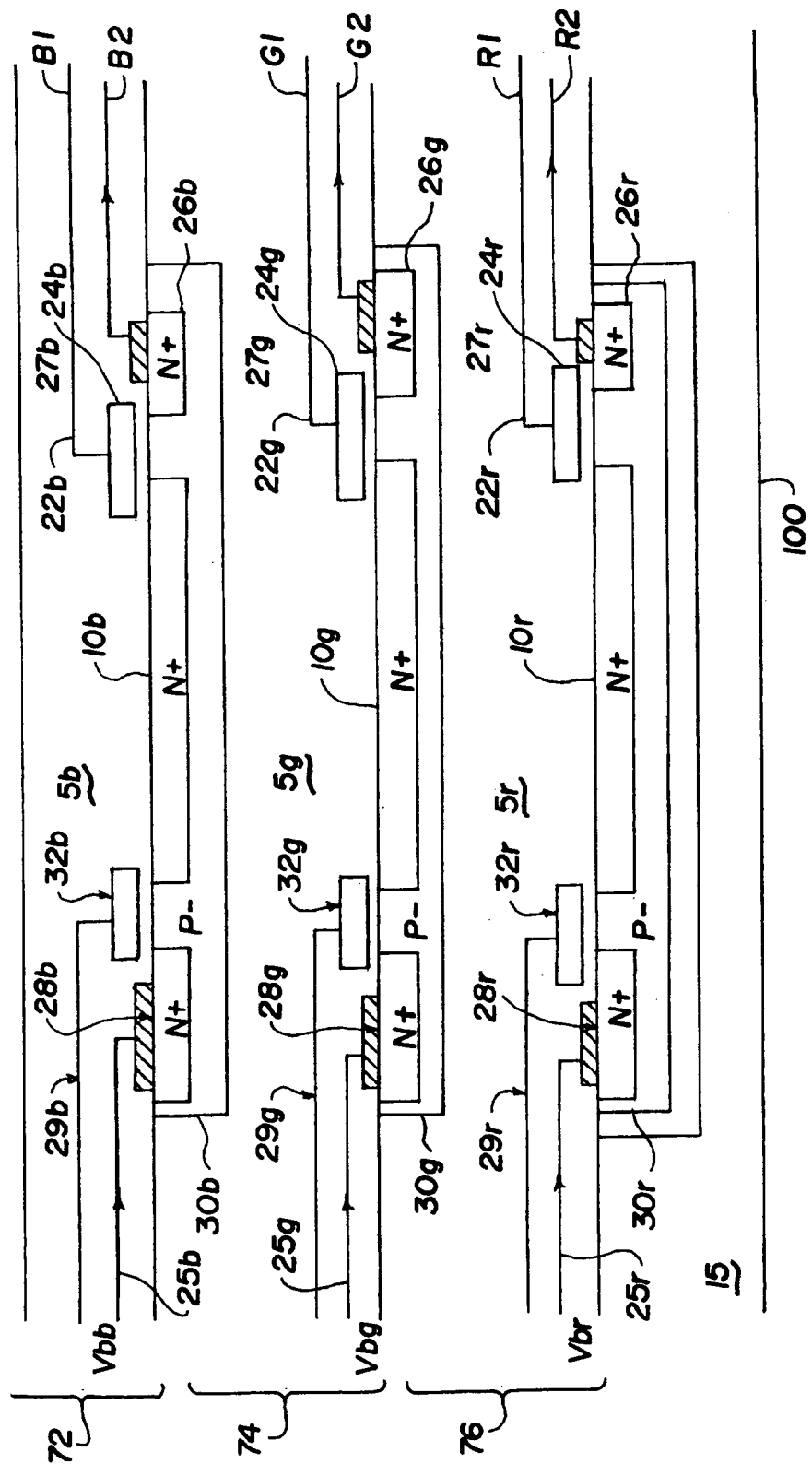
FIG. 5 is an alternative top and sectional view of the cell of the photodetector cell array of FIG. 2, as seen from sectional lines III—III.

A second alternate embodiment of the color photodetector cell 100 as seen from section lines III—III is shown in FIG. 5b to which reference should now be made.

As with the embodiment of FIG. 4, the color photodetector cell 100 includes a blue section 72, a green section 74, and a red section 76 that are formed in or on a substrate 15. Each section includes an N+ region 10 that is located beneath a dielectric layer 5. Unlike the embodiment of FIG. 4, each section includes a charge transistor 29 that includes the N+ region 28, a gate region 32, a charge lead 25 that biases the charge transistor 29 "on". Like the embodiment of FIG. 4, each section includes a read transistor 27 formed by part of the N+ region 10, a gate 24, and an N+ region 26.

In reference to the blue color detector cell 72, the charge transistor 29b applies the voltage Vbb to the N+ region 10b. The charge or magnitude of the charge can determine the sensitivity of the cell 72. Additionally, the dielectric layer 5b can be transparent or selected to pass the full spectrum of light to the N+ region 10b in P-region 30b. Transistor 27b when put in the conductive state by the magnitude of the signal on conductor 22b passes the blue output under control of signal B1 via conductor B2. B2 is connected to the N+ region 26b.

Similarly, in reference to the green color detector cell 74, an input transistor 29g applies the voltage Vbg to the N+ region 10g. The dielectric layer 5g can be selected to be transparent, to wavelengths longer than the blue light that is absorbed by the blue detector, so that when properly charged the N+ region 10g will detect the green light. Conductor 22g uses signal G1 to enable the read operation so that the signal on conductor G2 can be passed to the pixel detector 6 of FIG. 1.

Similarly, the red photodetector cell 76 is charged by Vbr being passed through transistor 27g to the N+ region 10r. Conductor 22r enables the charge detector 10r. A dielectric layer 5r transmits the red light still remaining from the multicolor input light to the detector 10r so that output signal may be applied to the pixel detector 6, when the signal on conductor 22r activates transistor 27r. It is important to note that each cell 72, 74, and 76 can be charged at the same time and also read at the same time, so there only needs to be provided to each pixel location an initial charge signal to charge the respective detectors and following which there is a read signal applied thereto.

Figure 6A:
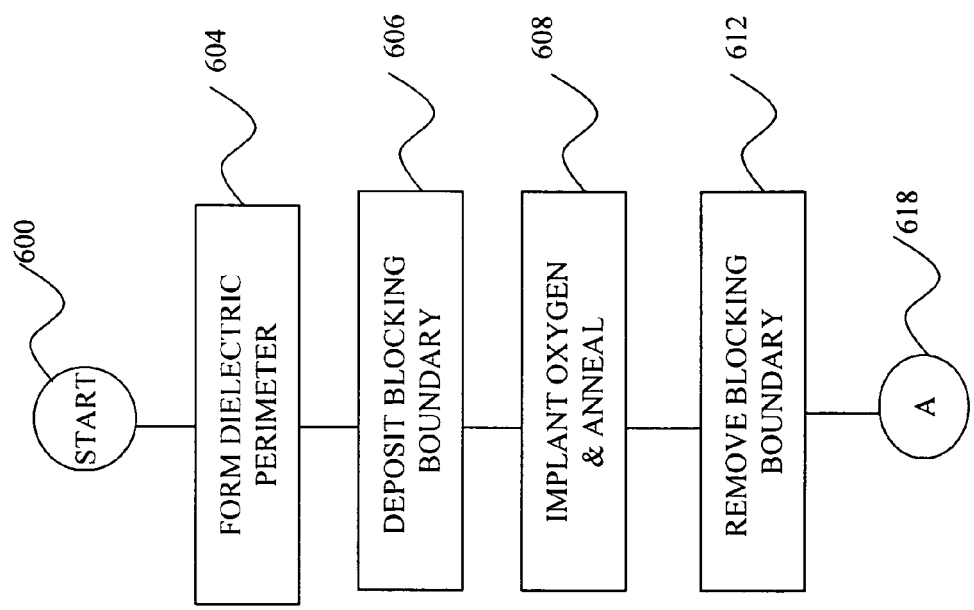
FIG. 6 are flow charts illustrating the process steps used to manufacture the device of FIG. 3.
Figure 6B:
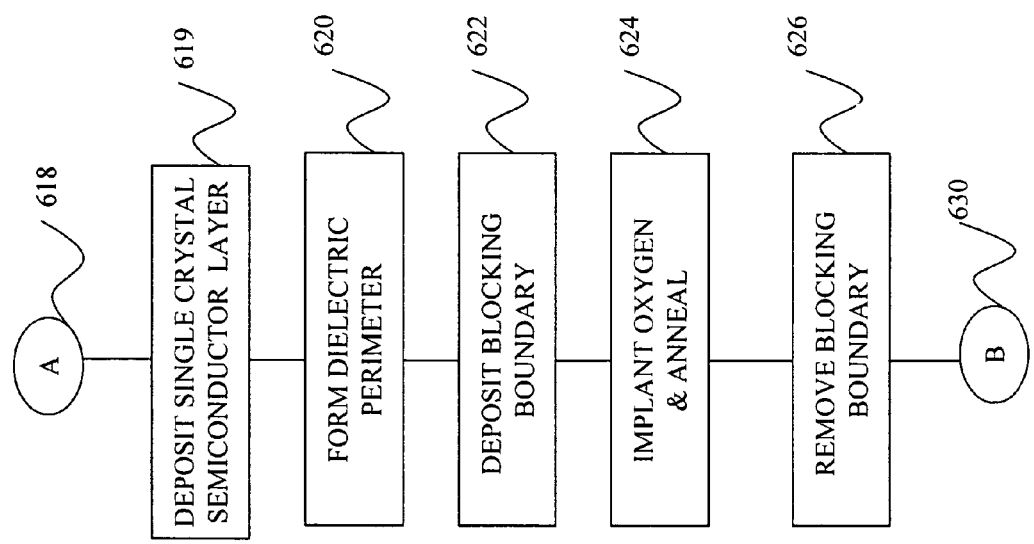
Figure 6C:
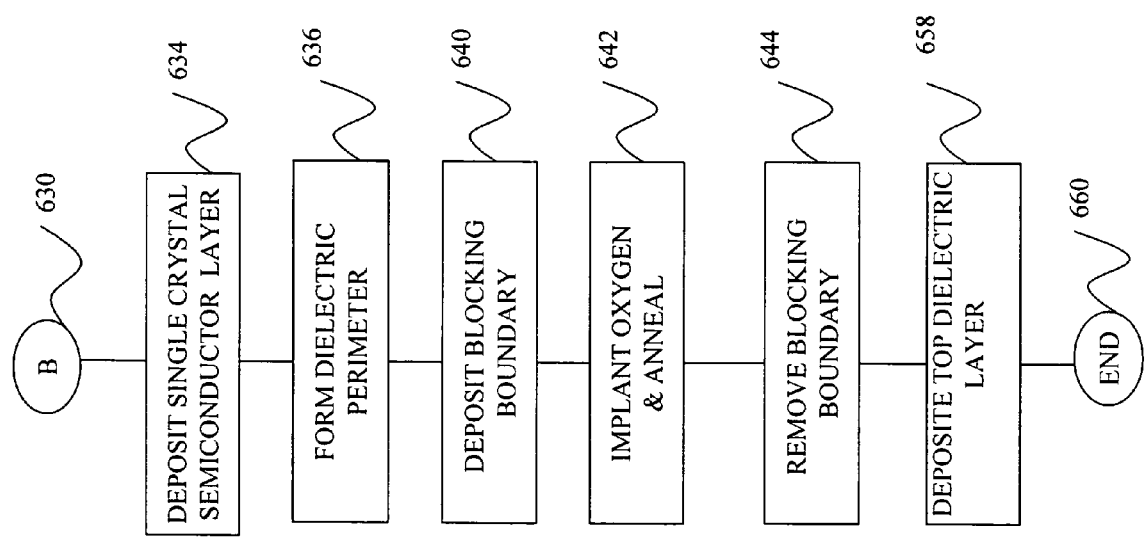

FIGS. 6 and 7 are used in conjunction to illustrate the process steps used to manufacture the multi-color sensor photodetector shown in FIG. 3 through 5. At the start position 600 a semiconductor substrate 700 is used to initiate the manufacturing process. At block 604 a dielectric perimeter 702 is formed around a single crystal region that will be used as a photodetector cell by etching trench and forming a dielectric layer that fills the trench. At block 606 a blocking boundary layer 704 is deposited to prevent ion implantation where not required, as shown at FIG. 7b. This process sequence shows the use of a material for a blocking boundary such as an oxide or nitride layer that can withstand high temperatures. It is also possible to use photoresist for the blocking boundary. In this instance, step 612 would occur prior to step 608. After the blocking layer is deposited, an ion implant of oxygen is performed at block 608, shown in FIG. 7c at area 705. FIG. 7d shows an anneal process being performed to create a dielectric region areas 702 and 710 around the sides and bottoms of the single crystal region 711. Next, the blocking boundary is removed, block 612. Block 618 of FIG. 6a is the end of the fabrication of the first level of single crystal semiconductor, but block 618 is also the beginning of FIG. 6b.

Figure 7D:
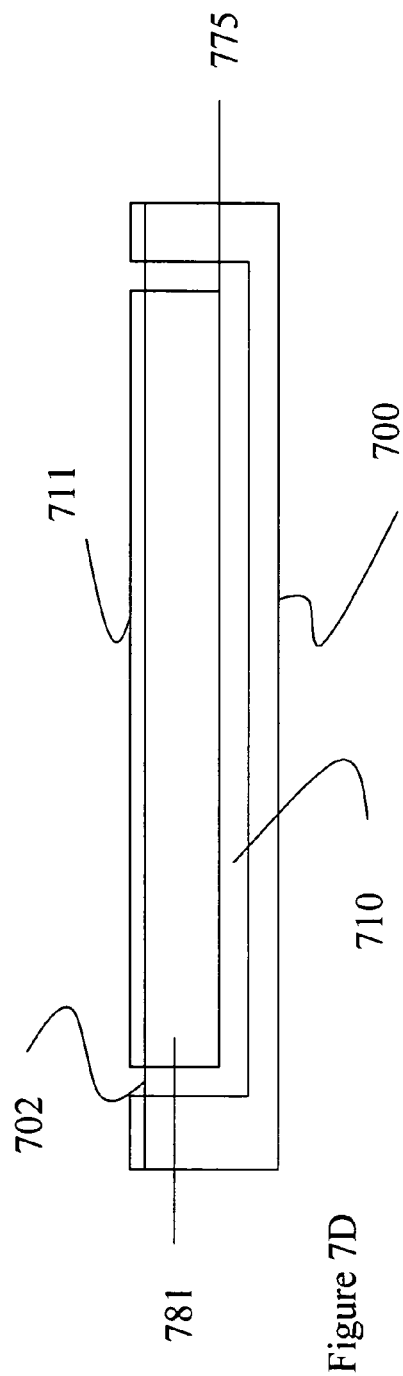
FIG. 7 are diagrams illustrating the steps of FIG. 6.
Figure 7E:
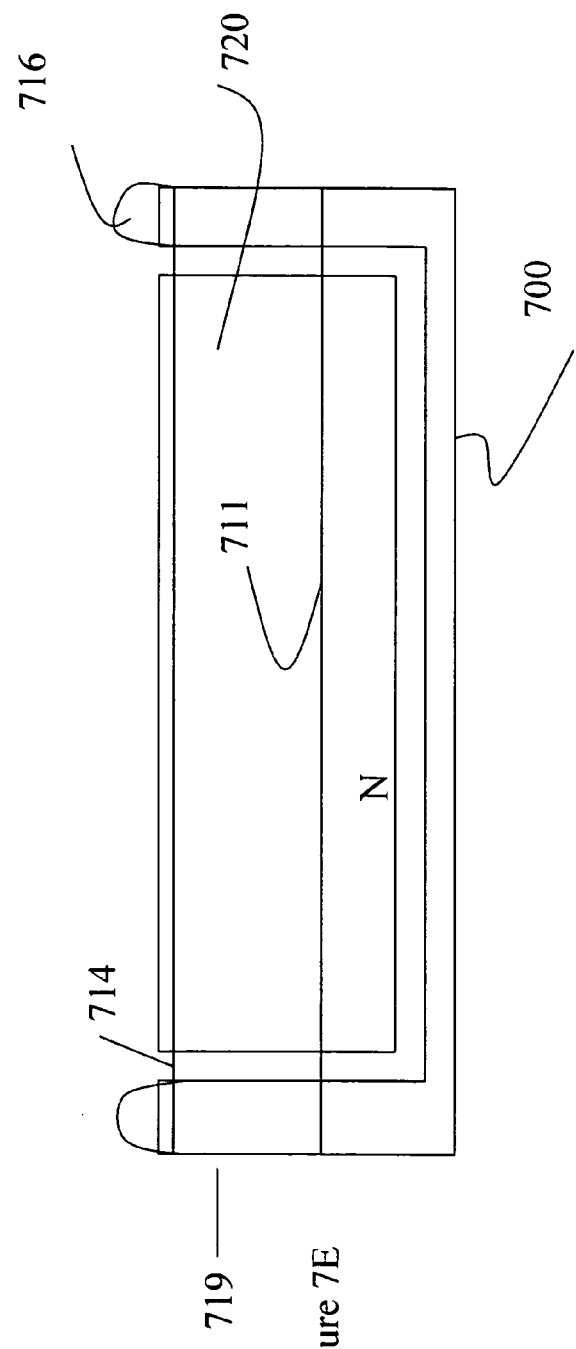
Figure 7F:
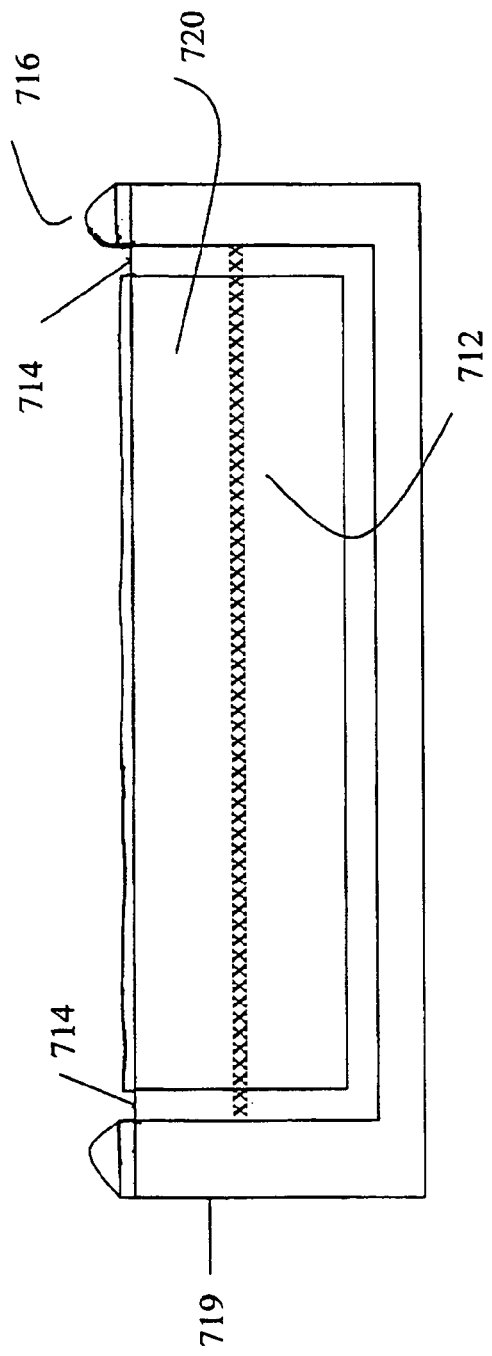
Figure 7G:
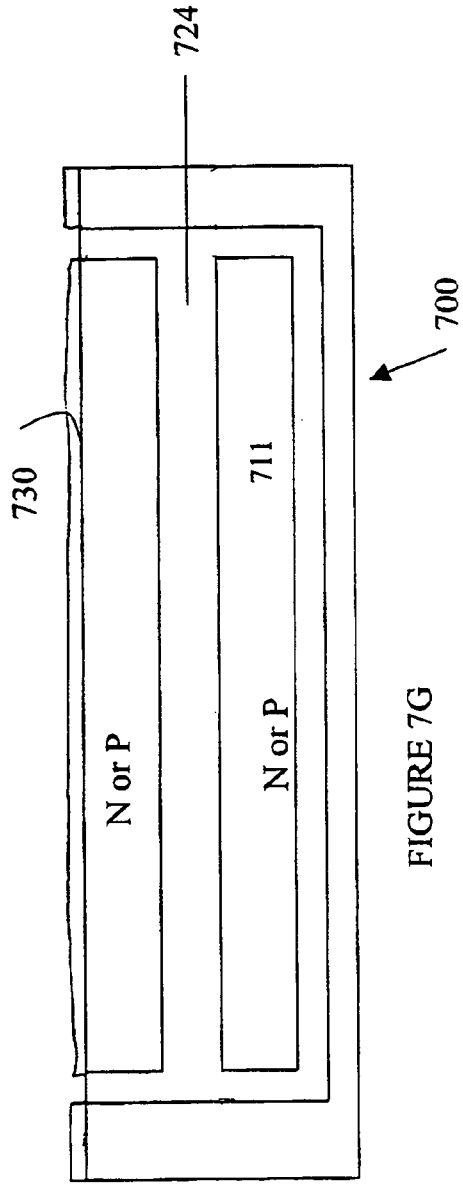

Block 619 of FIG. 6*b* continues with a single crystal semiconductor layer 719 deposited over the substrate 700, except for the dielectric perimeter region. Block 620, the semiconductor layer is masked, patterned, etched and a dielectric perimeter layer 714 is formed around the single crystal semiconductor region 720 and a blocking boundary 716 is deposited. FIG. 7*f,* oxygen 712 is implanted and annealed at block 624, leaving a single crystal structure 730 of FIG. 7*g,* on top of the previous single crystal structure 711. The blocking layer 716 of FIG. 7*f* has been removed according to block 626. The order of the blocking boundary removal step and the anneal step may be reversed as discussed earlier. It should be noted that the conductivity of each layer can be established by either depositing the desired conductivity or by ion implant. Block 630 of FIG. 6*b* is the end of the fabrication of the second level of single crystal semiconductor, but it is also the beginning of FIG. 6*c*. FIG. 7*g* shows dielectric layer 724 separating single crystal regions 711 and 730.

Figure 7H:
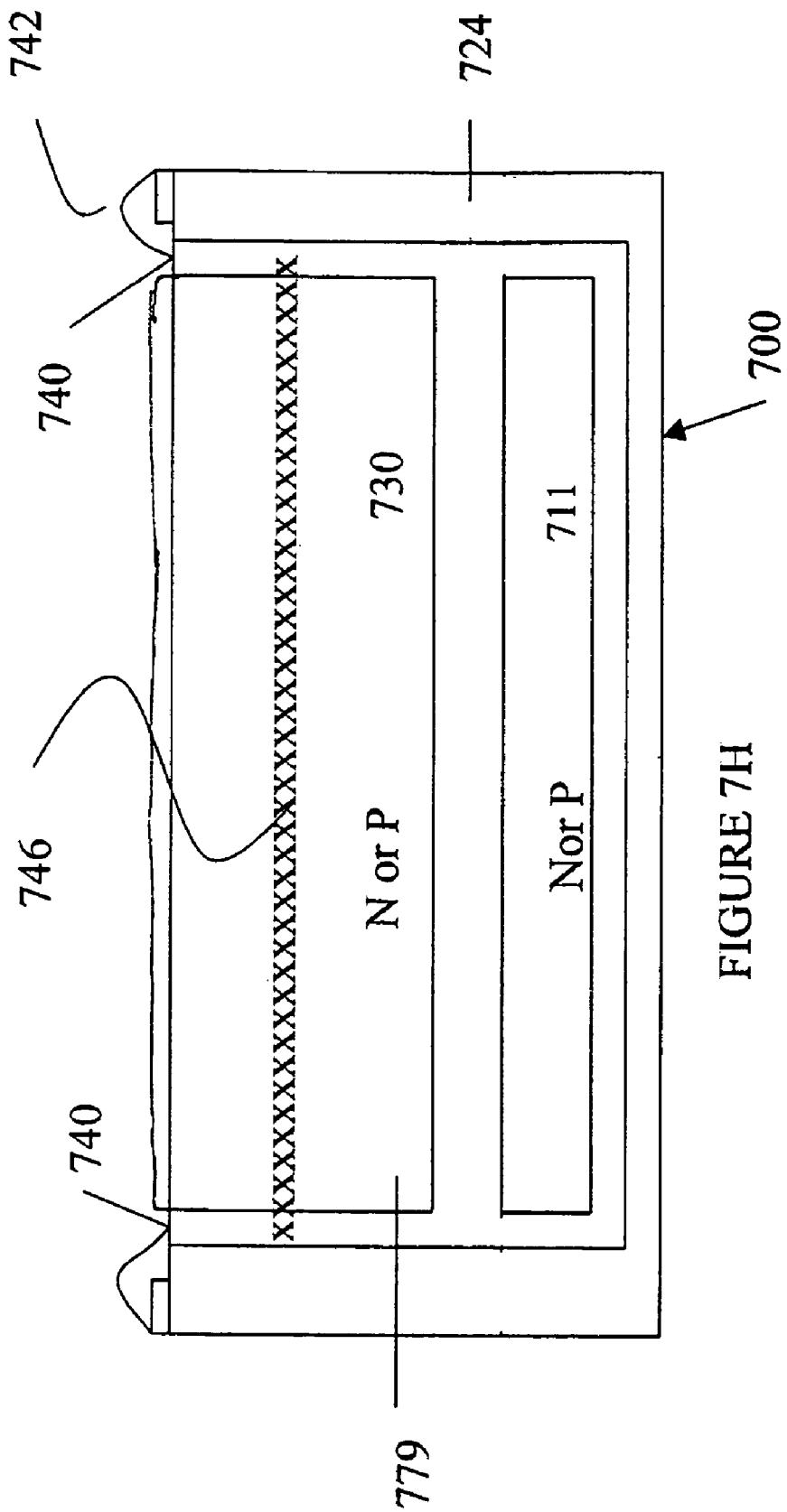
Figure 7I:
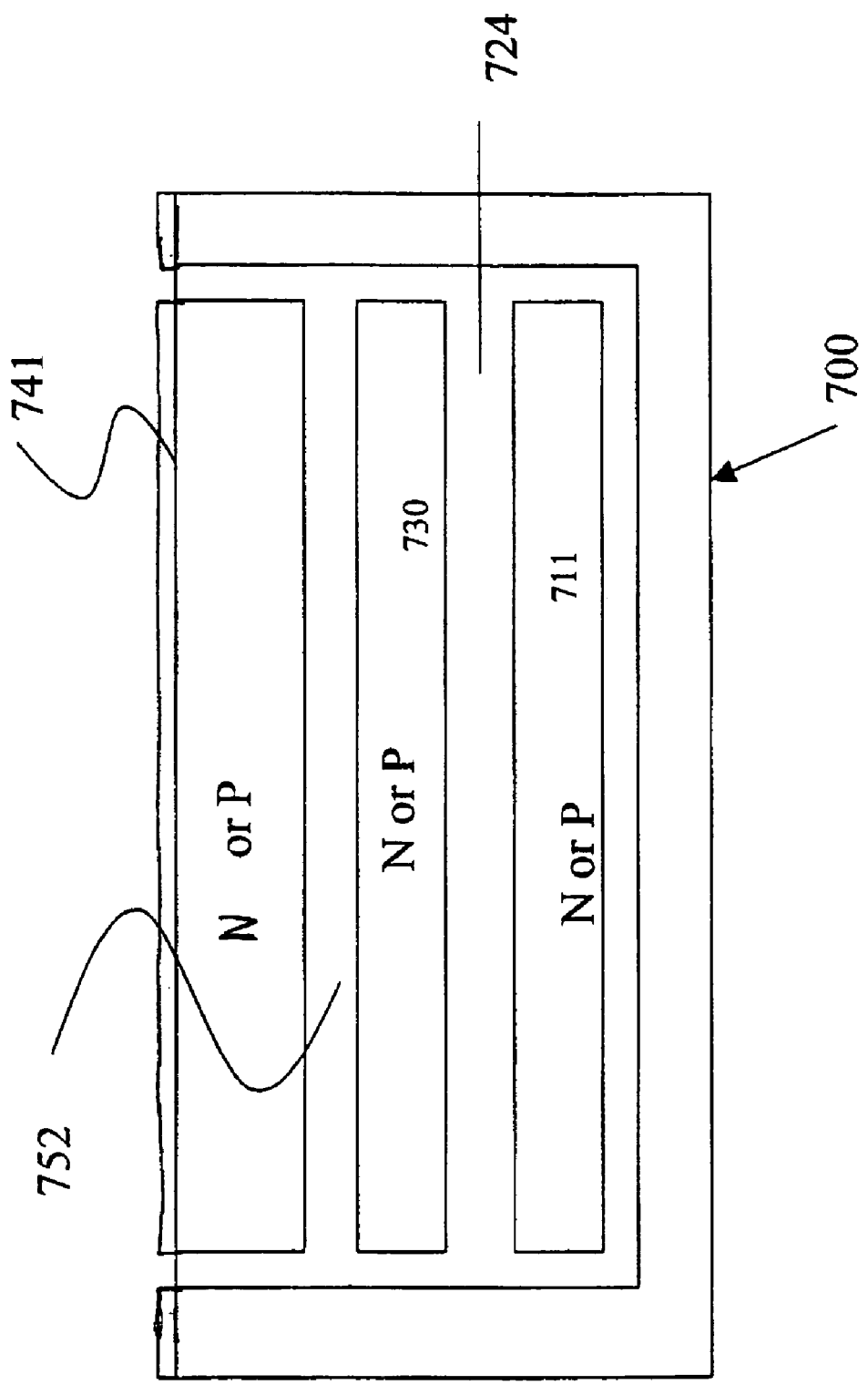
Figure 7J:
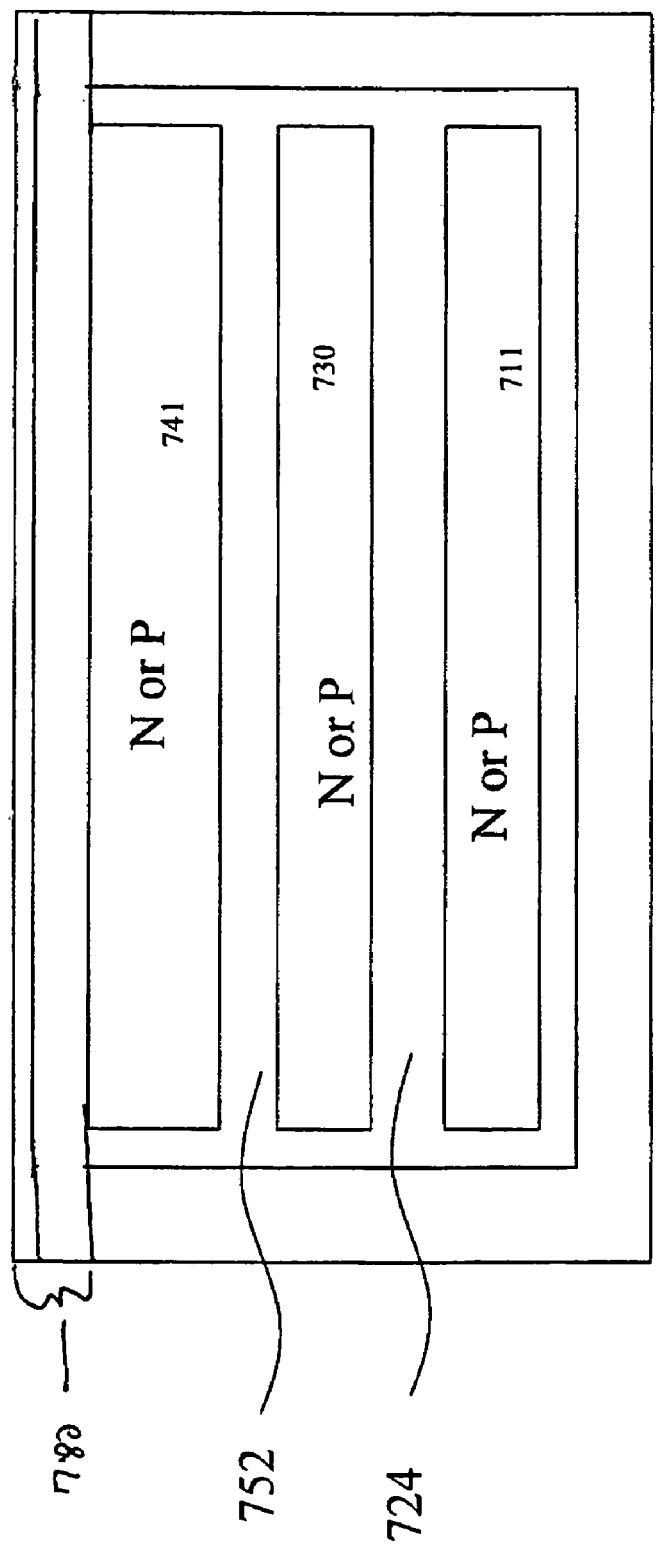

The next layer is formed similarly by depositing a layer of single crystal silicon above region 730 as shown in FIG. 7*h,* block 634. The single semiconductor crystal 738 is masked, patterned, and etched to form a dielectric perimeter layer 740, block 636. The process continues with the blocking boundary 742 deposited. Next, an ion implant step, 746 and an anneal step is performed, block 642, producing dielectric layer 752. The order of the blocking boundary removal step and the anneal step may be reversed as discussed earlier. The blocking boundary 742 is removed, block 644. FIG. 7*i* illustrates this process by showing a layer of single crystal semiconductor material 741 isolated by dielectric layer and boundary 752.

A top dielectric layer 780 is next formed, block 658, and the three dielectrically isolated layers of semiconductor are completed and ready for further processing, block 660. (Dielectric layer 780 is shown as consisting of two different dielectrics, though once or more than one may be deposited.)

Figure 8A:
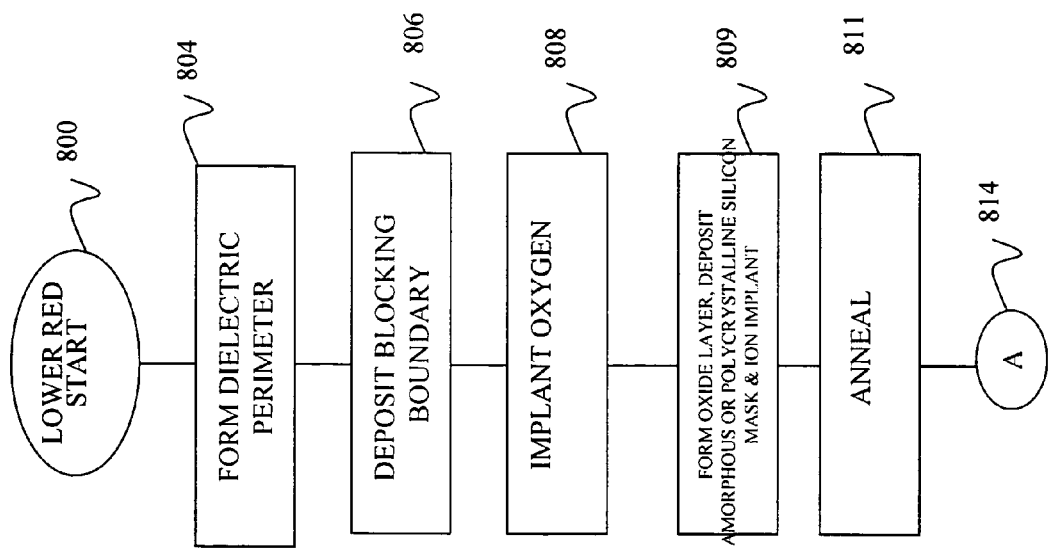
FIG. 8 are flow charts illustrating the process steps used to manufacture the device of FIGS. 4 or 5.
Figure 8B:
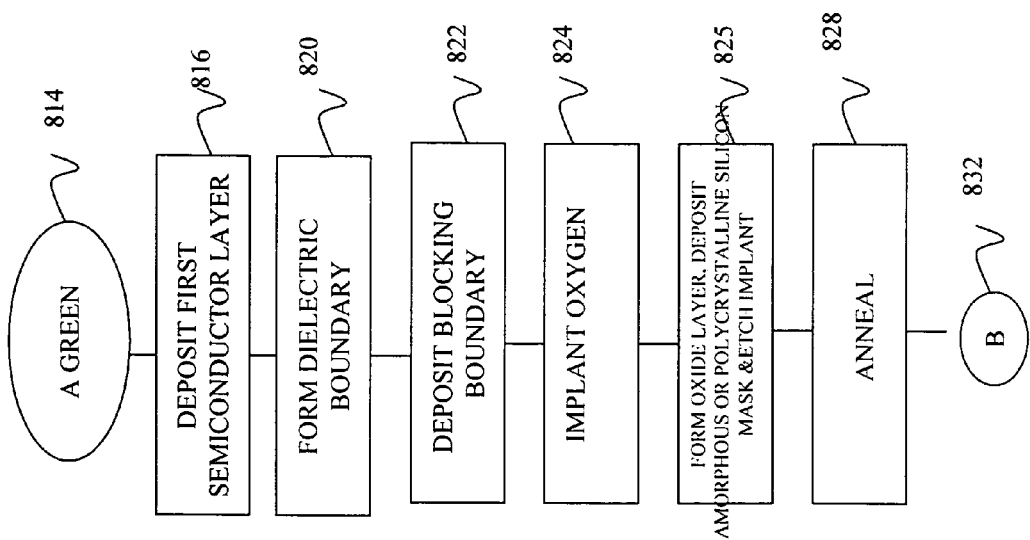

FIGS. 8 and 9 are used in conjunction to illustrate the process steps used to manufacture the device of FIG. 5. The device shown in FIG. 4 has the same flow, but only one MOSFET. Starting with the start block 800 the process begins with the formation of the lower portion of the red detector. A semiconductor substrate 900 is masked, etched and the dielectric perimeter 902 is formed as shown at FIG. 9*b* surrounding the area where the red photodetector will be formed. At block 806 the blocking boundary 904 is deposited, FIG. 9*c,* and the process proceeds to an oxygen implant at block 808. FIG. 9*d* illustrates the implant of oxygen by arrows 905. After the oxygen is implanted, an anneal process can be performed, however, because there is an additional ion implant or implants, it may be necessary to delay the annealing of the oxygen until all of the implants are made or to limit the anneal process. Block 809, forms the sources and drains of transistors 23 and 27 of FIGS. 4 and 5 and FIG. 9*e*. The substrate 900 is masked with mask 901 and an ion implant is performed as represented by arrows 903 of FIG. 9*e*. An anneal process is then performed, block 811. The substrate 900 includes a dielectric perimeter 902 that surrounds the red detector and includes a body region 906 that is opposite in conductivity type to that the implant areas 905, 907 and 909 of FIG. 9*f*. An oxide layer is then formed over the gate conductors.

Figure 9A:
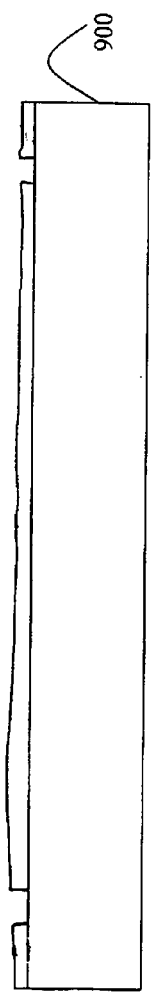
FIG. 9 are diagrams illustrating the steps of FIG. 8.
Figure 9B:
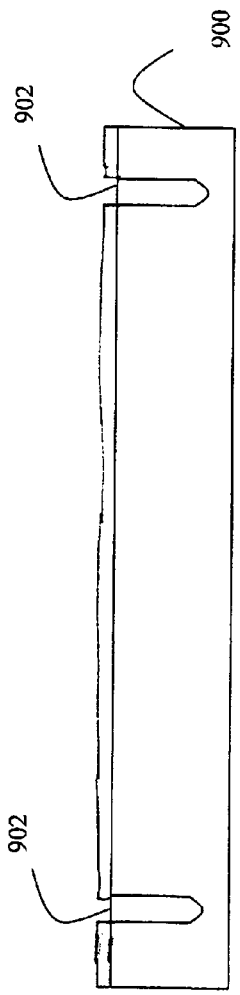
Figure 9C:
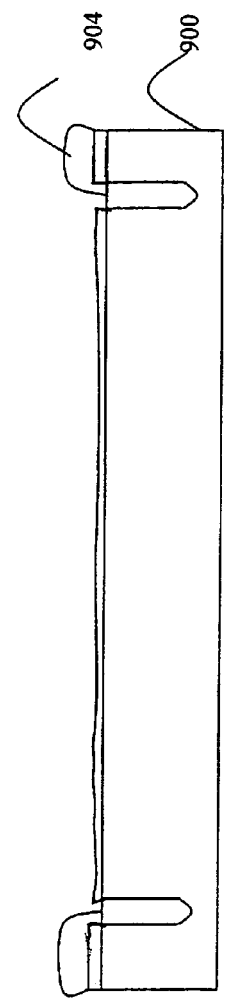
Figure 9D:
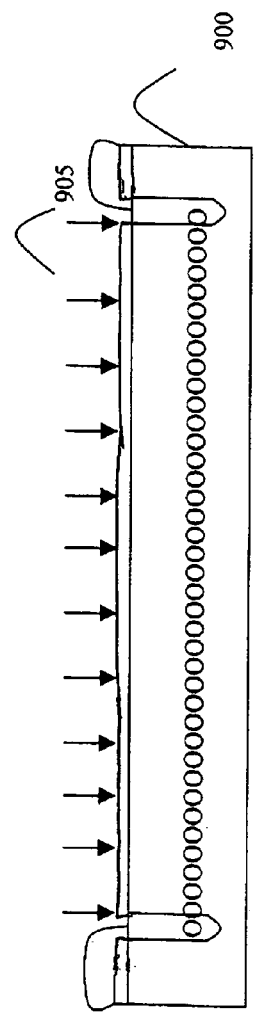
Figure 9I:
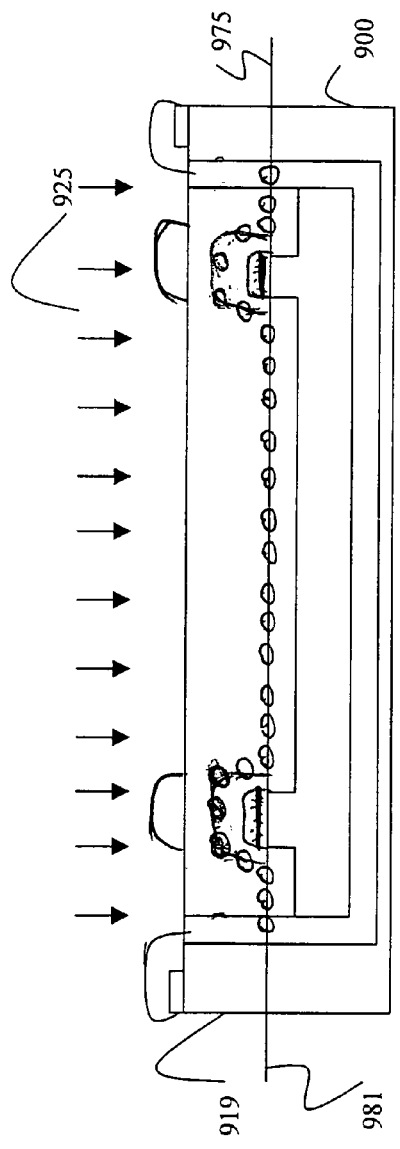
Figure 9J:
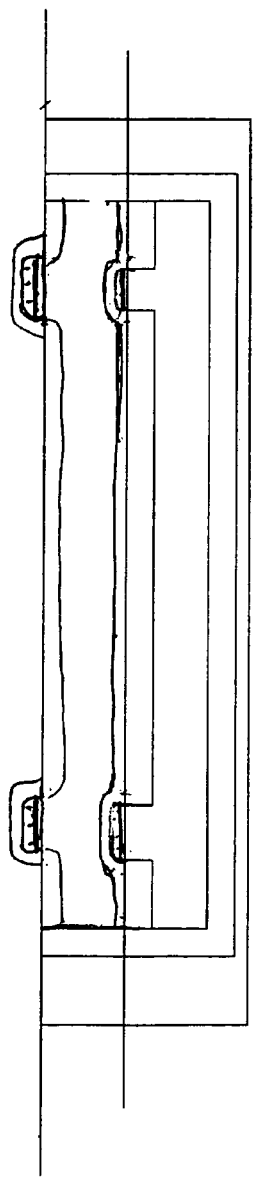

At A connector point 814, the process continues to step 816 where the oxide in the field is removed and the first semiconductor layer 919 is deposited over the substrate 900. A dielectric boundary 917 is created at block 820, and the blocking boundary 914 is deposited at block 822, as shown in FIG. 9*h*. At FIG. 9*i,* an ion implant of oxygen 925 is performed over the deposited semiconductor layer 919. The gate dielectric is formed, the gate conductor is deposited and the unit is masked and etched at step 825, followed by an implant and anneal process, and then the blocking boundary removed at block 828. A dielectric is formed to protect the gate conductor, then the oxide is removed from the field.

Figure 8C:
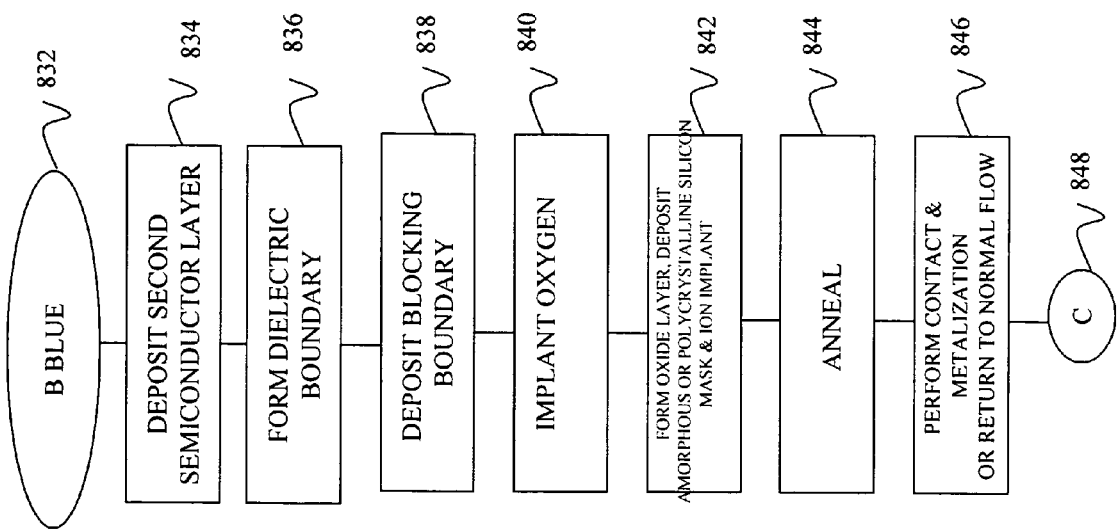
Figure 9K:
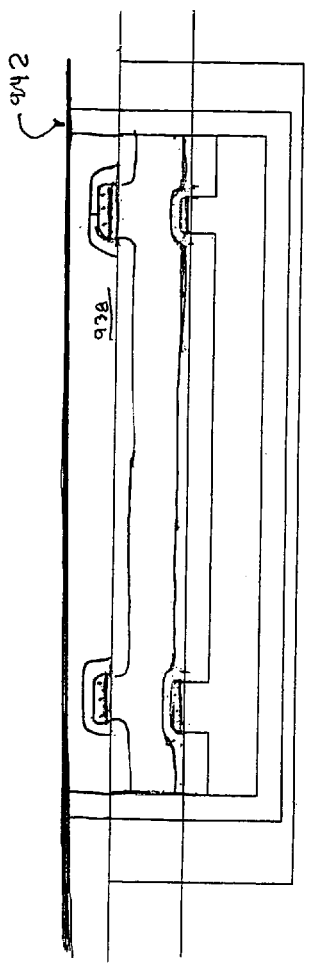
Figure 9L:
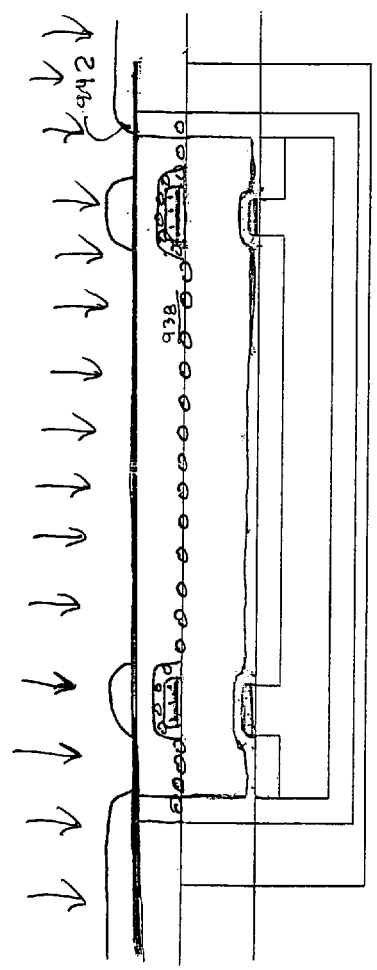
Figure 9M:
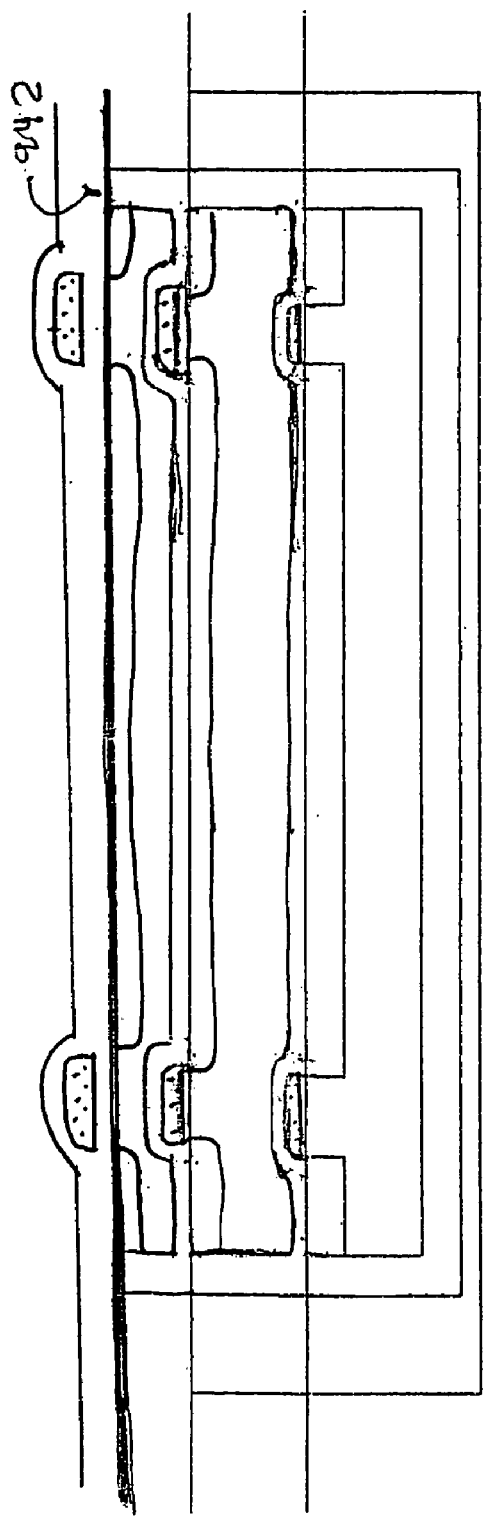

At B connector 832, the process proceeds to connect at FIG. 8*c* where the blue detector is created. The first step, block 834, is to deposit the second semiconductor layer 938 as shown at FIG. 9*k*. In block 836, a dielectric boundary 940 is created following which the blocking boundary 942 is deposited, block 838. An oxygen implant 946 is then performed, block 840, as shown in FIG. 9L. Block 842, and shown in FIG. 9*m,* an oxide layer is formed over the second semiconductor layer 938, a gate conductor is deposited, masked and etched, and source, photodiode, and drain regions are formed by implants. An anneal process is performed. Next, contacts are formed and the metalization process is performed, block 846, or the wafer returns to the standard process flow.

The invention claimed is:

1. A method of fabricating a multilayer color sensing photodetector, comprising the steps of;

forming a dielectric boundary in a semiconductor substrate to form a single crystalline region within the semiconductor substrate;

depositing a blocking layer to a first surface of the semiconductor substrate to define an implant area around the single crystalline region;

implanting ions into the implant area;

annealing the semiconductor substrate to create a dielectric layer beneath the single crystalline region, the dielectric layer being in contact with the dielectric boundary; depositing a layer of semiconductor material on a first surface of at least the single crystalline region;

forming a second dielectric boundary in the layer of semiconductor material to form a second single crystalline region within the layer of semiconductor material;

depositing a blocking layer to a first surface of the layer of semiconductor material to pattern a second implant area around the second single crystalline region;

implanting ions into the second implant area;

annealing the semiconductor substrate to create a second dielectric layer beneath the second single crystalline region, the second dielectric layer being in contact with the second dielectric boundary;

depositing a second layer of semiconductor material on a first surface of at least the second single crystalline region;

forming a third dielectric boundary in the second layer of the semiconductor material to form a third single crystalline region within the second layer of the semiconductor material;

depositing a second blocking layer to a first surface of the second layer of semiconductor material to pattern a third implant area;

implanting ions into the third implant area; and annealing the second semiconductor layer to create a third dielectric layer beneath the third single crystalline region, the third dielectric layer being in contact with the third dielectric boundary.

2. The method of fabricating a multilayer color sensing photodetector according to claim 1 further comprising the step of forming a fourth dielectric layer over the third single crystalline region.

3. The method of fabricating a multilayer color sensing photodetector according to claim 1 wherein the semiconductor substrate is of a first conductivity type and the step of implanting ions in the implant area, further comprises the steps of:
   depositing a blocking layer over at least the single crystalline region to pattern a conductivity type doping area; and
   doping the single crystalline region to create a region of a second conductivity type.

4. The method of fabricating a multilayer color sensing photodetector according to claim 3 further including the steps of:
   masking a pattern to define a conductor strip for connecting the single crystalline region to a bonding pad; and
   depositing a conductive material on the defined conductor strip.

5. The method of fabricating a multilayer color sensing photodetector according to claim 4 wherein the step of masking a pattern to define a conductor strip for connecting the single crystalline region to a bonding pad further includes the step of:
   defining a second conductor strip; and
   depositing a conductive material on the defined conductor strip further includes the step of depositing the conductive material on the second defined conductor strip.

6. The method of fabricating a multilayer color sensing photodetector according to claim 4 wherein the semiconductor layer is of the first conductivity type and the step of implanting ions in the implant area, further comprises the steps of:
   depositing a blocking layer over at least the second single crystalline region to pattern a conductivity type doping area; and
   doping the second single crystalline region to create a region of the first conductivity type.

7. The method of fabricating a multilayer color sensing photodetector according to claim 6 further including the steps of:
   masking a pattern on the first surface of the second single crystalline region to define a conductor strip for connecting the second single crystalline region to a bonding pad; and
   depositing a conductive material on the defined conductor strip.

8. The method of fabricating a multilayer color sensing photodetector according to claim 7 wherein the step of masking a pattern to define a conductor strip for connecting the second single crystalline region to a bonding pad further includes the step of defining a second conductor strip; and
   the step of depositing a conductive material on the defined conductor strip further includes the step of depositing the conductive material on the second defined conductor strip.

9. The method of fabricating a multilayer color sensing photodetector according to claim 7 wherein the second semiconductor layer is of the first conductivity type and the step of implanting ions in the implant area, further comprises the steps of:
   depositing a blocking layer over at least the third single crystalline region to pattern a conductivity type doping area; and
   doping the single crystalline region to create a region of the second conductivity type.

10. The method of fabricating a multilayer color sensing photodetector according to claim 9 further including the steps of:
    masking a pattern on the first surface of the third single crystalline region to define a conductor strip for connecting the third single crystalline region to a bonding pad; and
    depositing a conductive material on the defined conductor strip.

11. The method of fabricating a multilayer color sensing photodetector according to claim 10 wherein the step of masking a pattern to define a conductor strip for connecting the third single crystalline region to a bonding pad further includes the step of defining a second conductor strip; and
    the step of depositing a conductive material on the defined conductor strip further includes the step of depositing the conductive material on the second defined conductor strip.

12. The method of fabricating a multilayer color sensing photodetector according to claim 10 further comprising the step of forming a fourth dielectric layer over the third single crystalline region.

13. The method of fabricating a multilayer color sensing photodetector according to claim 3 wherein the semiconductor layer is of the first conductivity type and the step of implanting ions in the implant area, further comprises the steps of:
    depositing a blocking layer over at least the second single crystalline region to pattern a conductivity type doping area; and
    doping the second single crystalline region to create a region of the first conductivity type.

14. The method of fabricating a multilayer color sensing photodetector according to claim 13 wherein the second semiconductor layer is of the first conductivity type and the step of implanting ions in the implant area, further comprises the steps of:
    depositing a blocking layer over at least the third single crystalline region to pattern a conductivity type doping area; and
    doping the single crystalline region to create a region of the second conductivity type.

15. The method of fabricating a multilayer color sensing photodetector according to claim 14 further comprising the step of forming a fourth dielectric layer over the third single crystalline region.

16. A method of fabricating a multilayer color sensing photodetector, comprising the steps of:
    forming a dielectric boundary in a semiconductor substrate to form a single crystalline region within the semiconductor substrate;
    depositing a blocking layer to a first surface of the semiconductor substrate to define an implant area around the single crystalline region;
    implanting ions into the implant area;
    forming a second dielectric boundary in the layer of semiconductor material to form a second single crystalline region within the layer of semiconductor material;
    depositing a blocking layer to a first surface of the layer of semiconductor material to pattern a second implant area around the second single crystalline region;
    implanting ions into the second implant area;
    depositing a second layer of semiconductor material on a first surface of at least the second single crystalline region;
    forming a third dielectric boundary in the second layer of the semiconductor material to form a third single crystalline region within the second layer of the semiconductor material;

depositing a second blocking layer to a first surface of the second layer of semiconductor material to pattern a third implant area;

implanting ions into the third implant area; and annealing the semiconductor substrate, the semiconductor layer and the second semiconductor layer to create a dielectric layer beneath the single crystalline region, the dielectric layer being in contact with the dielectric boundary, a second dielectric layer beneath the second single crystalline region, the second dielectric layer being in contact with the second dielectric boundary, and to create a third dielectric layer beneath the third single crystalline region, the third dielectric layer being in contact with the third dielectric boundary.

17. The method of fabricating a multilayer color sensing photodetector according to claim 16 further comprising the step of forming a fourth dielectric layer over the third single crystalline region.

18. The method of fabricating a multilayer color sensing photodetector according to claim 16 wherein the semiconductor substrate is of a first conductivity type and the step of implanting ions in the implant area, further comprises the steps of:

depositing a blocking layer over at least the single crystalline region to pattern a conductivity type doping area; and doping the single crystalline region to create a region of a second conductivity type.

19. The method of fabricating a multilayer color sensing photodetector according to claim 18 further including the steps of:

masking a pattern to define a conductor strip for connecting the single crystalline region to a bonding pad; and depositing a conductive material on the defined conductor strip.

20. The method of fabricating a multilayer color sensing photodetector according to claim 19 wherein the step of masking a pattern to define a conductor strip for connecting the single crystalline region to a bonding pad further including the step of defining a second conductor strip; and the step of depositing a conductive material on the defined conductor strip further includes the step of depositing the conductive material on the second defined conductor strip.

21. The method of fabricating a multilayer color sensing photodetector according to claim 20 wherein the semiconductor layer is of the first conductivity type and the step of implanting ions in the implant area, further comprises the steps of:

depositing a blocking layer over at least the second single crystalline region to pattern a conductivity type doping area; and doping the second single crystalline region to create a region of the first conductivity type.

22. The method of fabricating a multilayer color sensing photodetector according to claim 21 further including the steps of:

masking a pattern on the first surface of the second single crystalline region to define a conductor strip for connecting the second single crystalline region to a bonding pad; and depositing a conductive material on the defined conductor strip.

23. The method of fabricating a multilayer color sensing photodetector according to claim 22 wherein the step of masking a pattern to define a conductor strip for connecting the second single crystalline region to a bonding pad further includes the step of defining a second conductor strip; and the step of depositing a conductive material on the defined conductor strip further includes the step of depositing the conductive material on the second defined conductor strip.

24. The method of fabricating a multilayer color sensing photodetector according to claim 22 wherein the second semiconductor layer is of the first conductivity type and the step of implanting ions in the implant area, further comprises the steps of:

depositing a blocking layer over at least the third single crystalline region to pattern a conductivity type doping area; and doping the single crystalline region to create a region of the second conductivity type.

25. The method of fabricating a multilayer color sensing photodetector according to claim 24 further including the steps of:

masking a pattern on the first surface of the third single crystalline region to define a conductor strip for connecting the third single crystalline region to a bonding pad; and depositing a conductive material on the defined conductor strip.

26. The method of fabricating a multilayer color sensing photodetector according to claim 25 wherein the step of masking a pattern to define a conductor strip for connecting the third single crystalline region to a bonding pad further includes the step of defining a second conductor strip; and the step of depositing a conductive material on the defined conductor strip further includes the step of depositing the conductive material on the second defined conductor strip.

27. The method of fabricating a multilayer color sensing photodetector according to claim 25 further comprising the step of forming a fourth dielectric layer over the third single crystalline region.

28. The method of fabricating a multilayer color sensing photodetector according to claim 18 wherein the semiconductor layer is of the first conductivity type and the step of implanting ions in the implant area, further comprises the steps of:

depositing a blocking layer over at least the second single crystalline region to pattern a conductivity type doping area; and doping the second single crystalline region to create a region of the first conductivity type.

29. The method of fabricating a multilayer color sensing photodetector according to claim 28 wherein the second semiconductor layer is of the first conductivity type and the step of implanting ions in the implant area, further comprises the steps of:

depositing a blocking layer over at least the third single crystalline region to pattern a conductivity type doping area; and doping the single crystalline region to create a region of the second conductivity type.

30. The method of fabricating a multilayer color sensing photodetector according to claim 29 further comprising the step of forming a fourth dielectric layer over the third single crystalline region.

* * * * *